United States Patent [19]
Yu

[11] Patent Number: 5,909,347
[45] Date of Patent: Jun. 1, 1999

[54] ELECTROSTATIC DISCHARGE PROTECTION CIRCUIT HAVING P-TYPE FLASH MEMORY CELL

[75] Inventor: Ta-Lee Yu, Hsinchu Hsien, Taiwan

[73] Assignee: Winbond Electronics Corp., Hsinchu, Taiwan

[21] Appl. No.: 09/073,163

[22] Filed: May 5, 1998

[30] Foreign Application Priority Data

Jan. 9, 1998 [TW] Taiwan ................................. 87100245

[51] Int. Cl.$^6$ ......................................................... H02H 9/00
[52] U.S. Cl. .............................. 361/56; 361/111; 357/355
[58] Field of Search ............................ 361/56, 91, 111, 361/54; 257/355

[56] References Cited

U.S. PATENT DOCUMENTS 5,666,307   9/1997   Chang ................................. 365/185.03
5,671,111   9/1997   Chen ......................................... 361/56

Primary Examiner—Sally C. Medley
Attorney, Agent, or Firm—Fish & Richardson P.C.

[57] ABSTRACT

An electrostatic discharge protection circuit protects an internal circuit that is coupled to a pad from electrostatic discharge damage. The electrostatic discharge protection circuit comprises a PNP transistor, a NPN transistor, and a P-type flash memory cell. The PNP and NPN transistors have an emitter, a base, and a collector, respectively. The PNP transistor is configured with its emitter connected to a power node, its base connected to the collector of the NPN transistor, its collector connected to the base of the NPN transistor. The emitter of the NPN transistor is connected to a circuit node. The flash memory cell is configured with a drain connected to the base of the NPN transistor, a source connected to the power node, and a control gate coupled to the power node. When electrostatic discharge stress occurs at the pad, the P-type flash memory cell enters breakdown to be programmed and triggers the conduction of the transistors.

8 Claims, 4 Drawing Sheets

ELECTROSTATIC DISCHARGE PROTECTION CIRCUIT HAVING P-TYPE FLASH MEMORY CELL

BACKGROUND OF THE INVENTION

1. Field of the Invention

The present invention generally relates to semiconductor integrated circuit technology. In particular, the present invention relates to an electrostatic discharge protection circuit having a P-type flash memory cell.

2. Description of the Prior Art

Electrostatic discharge, ESD hereinafter, is a common phenomenon that occurs during the handling of semiconductor integrated circuit, IC hereinafter, devices. Electrostatic charges may accumulate and cause potentially destructive effects on an IC device. ESD stressing typically can occur during a testing phase of IC fabrication, during installation of the IC onto a circuit board, as well as during use of equipment into which the IC has been installed. Damage to a single IC due to poor ESD protection in an electronic device can partially or sometimes completely disrupt its operation.

There are several ESD stress models based on the reproduction of typical discharge pulses to which the IC may be exposed during manufacturing or handling. Three standards models, known as the Human Body Model (HBM), Machine Model (MM), and Charged Device Model (CDM) have been proposed. The human-body model is set forth in U.S. Military Standard MIL-STD-883, Method 3015.6. The military standard models the electrostatic stress produced on an IC device when a human carrying electrostatic charges touches the lead pins of the IC device. The machine model is set forth in Industry Standard EIAJ-IC-121, which describes the electrostatic stress produced on an IC device when a machine carrying electric charges contacts the lead pins of the IC device The charged device model describes the ESD current generated when an IC already carrying electric charges is grounded while being handled.

However, with the trend toward submicron scale IC fabrication in view, CMOS IC have become more vulnerable to ESD damage due to advanced processes, such as use of a lightly-doped drain ("LDD") structure and clad silicide diffusions. Therefore, lateral silicon-controlled rectifiers (LSCRs) have been utilized as main components of ESD protection circuits for facilitating ESD protection. As an example, R. N. Rountree et al., "A PROCESS-TOLERANT INPUT PROTECTION CIRCUIT FOR ADVANCED CMOS PROCESSES," has been proposed in EOS/ESD Symp. Proc., EOS-10, pp.201–205, 1988.

Referring to FIG. 1, a conventional lateral silicon-controlled rectifier, hereinafter LSCR, is schematically illustrated in a top view. The conventional lateral silicon-controlled rectifier is fabricated in a P-type semiconductor substrate 10 having an N-well 11 formed therein. A P-type doped region 12 and an N-type doped region 13 are formed within the N-well 11 while another N-type doped region 14 and P-type doped region 15 are formed in the P-type semiconductor substrate 10. The P-type doped region 12 is electrically connected with the N-type doped region 13 to be an anode 16 of the LSCR while the N-type doped region 14 and P-type doped region 15 are tied together to be a cathode 17 thereof. A cross-sectional view taken along a line II—II of FIG. 1 is illustrated in FIG. 2.

As shown in FIG. 2, the P-type doped region 12, N-well 11, and P-type semiconductor substrate 10 serve as the emitter, base, and collector, respectively, of a PNP bipolar junction transistor. In addition, the N-well region 11, the P-type semiconductor substrate 10, and the N-type doped region 14 serve as the collector, base, and emitter, respectively, of a NPN bipolar junction transistor.

However, there is one inherent constraining design factor for the LSCR's used in ESD protection circuits for sub-micron semiconductor devices. The required voltage for triggering conventional LSCR's heavily relies upon the junction breakdown between the P-type semiconductor substrate 10 and the N-well 11, being therefore in the range of about 30–50 V. Nevertheless, the typical thickness of gate oxide layers in CMOS fabrication processes employing a resolution of 0.6–0.8 microns is about 150–200 angstroms. Taking a dielectric breakdown strength of 10 MV/cm for typical $SiO_X$ material into consideration, the gate oxide layers in these sub-micron CMOS devices would have been destroyed by a voltage of about 15–20 V. Even worse, as to 0.5 $\mu$m feature size CMOS technology with a gate oxide thickness of 105 angstroms, measurable Flower-Nordheim tunneling through the gate oxide starts at around 7 V and oxide breakdown occurs at about 14.5 V. Therefore, the conventional LSCR's have no effect on ESD protection for sub-micron CMOS IC devices.

Therefore, there is a need to provide an electrostatic discharge protection circuit that is triggered at a voltage lower than the breakdown voltage of gate oxide layers, especially suitable for sub-micron CMOS fabrication, to confirm ESD protection efficacy.

SUMMARY OF THE INVENTION

Therefore, an object of the present invention is to provide an electrostatic discharge protection circuit, which can be positioned at input pads or output pads, to be triggered at a low voltage so as to protect an internal circuit from ESD damage.

Another object of the present invention is to provide an electrostatic discharge protection circuit, which can record any ESD event occurring during phases of testing, installation, usage, etc.

A further object of the present invention is to provide an electrostatic discharge protection circuit having a P-type flash memory cell, whose control gate is free of floating under normal operation.

The present invention achieves the above-indicated objects by providing an electrostatic discharge protection circuit for protecting an internal circuit that is coupled to a pad. The electrostatic discharge protection circuit comprises a PNP transistor, a NPN transistor, and a P-type flash memory cell. The PNP and NPN transistors have an emitter, a base, and a collector, respectively. The PNP transistor is configured with its emitter connected to a power node, its base connected to the collector of the NPN transistor, and its collector connected to the base of the NPN transistor. The emitter of the NPN transistor is connected to the pad. Accordingly, the PNP transistor and the NPN transistor constitute a SCR device. The flash memory cell is configured with a drain connected to the base of the NPN transistor, a source connected to the power node, and a control gate coupled to the power node. When electrostatic discharge stress occurs at the pad, the flash memory cell enters breakdown to be programmed and triggers the conduction of the transistors.

Accordingly, when ESD stress occurs to the pad, the P-type flash memory cell first enters breakdown and then triggers the SCR to operate in the snapback region for bypassing the ESD stress, thereby protecting the internal circuit from ESD damage. By this way, the electrostatic discharge protection circuit according to the present invention can be triggered at the low voltage at which the P-type flash memory cell enters breakdown. Moreover, the electrostatic discharge protection circuit according to the present invention can record any ESD event occurring during phases of testing, installation, usage, etc.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

According to the present invention, an electrostatic discharge protection circuit is triggered to conduct a discharge current and thus bypass electrostatic discharge stress occurring to an integrated circuit pad by means of a P-type flash memory cell at a low trigger voltage. The detailed operation of the P-type memory cell has been disclosed in U.S. Pat. No. 5,666,307 as well.

Figure 1:
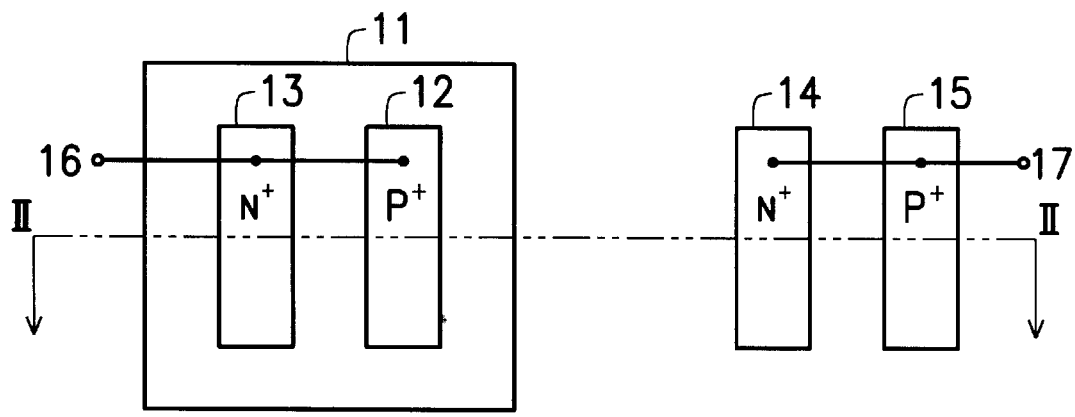
FIG. 1 schematically illustrates a conventional lateral silicon-controlled rectifier in a top view.
Figure 2:
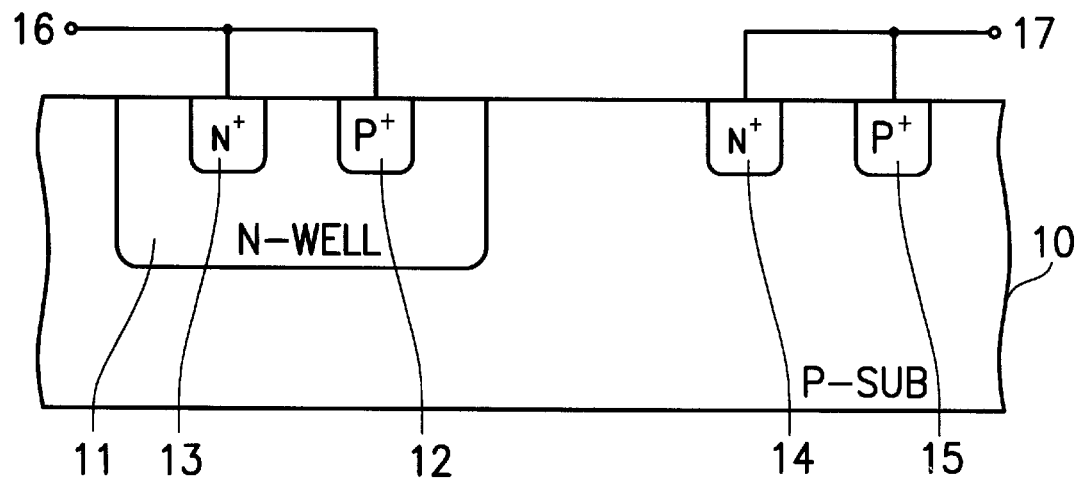
FIG. 2 schematically illustrates a cross-sectional view, taken along a line II—II, of FIG. 1.
Figure 3:
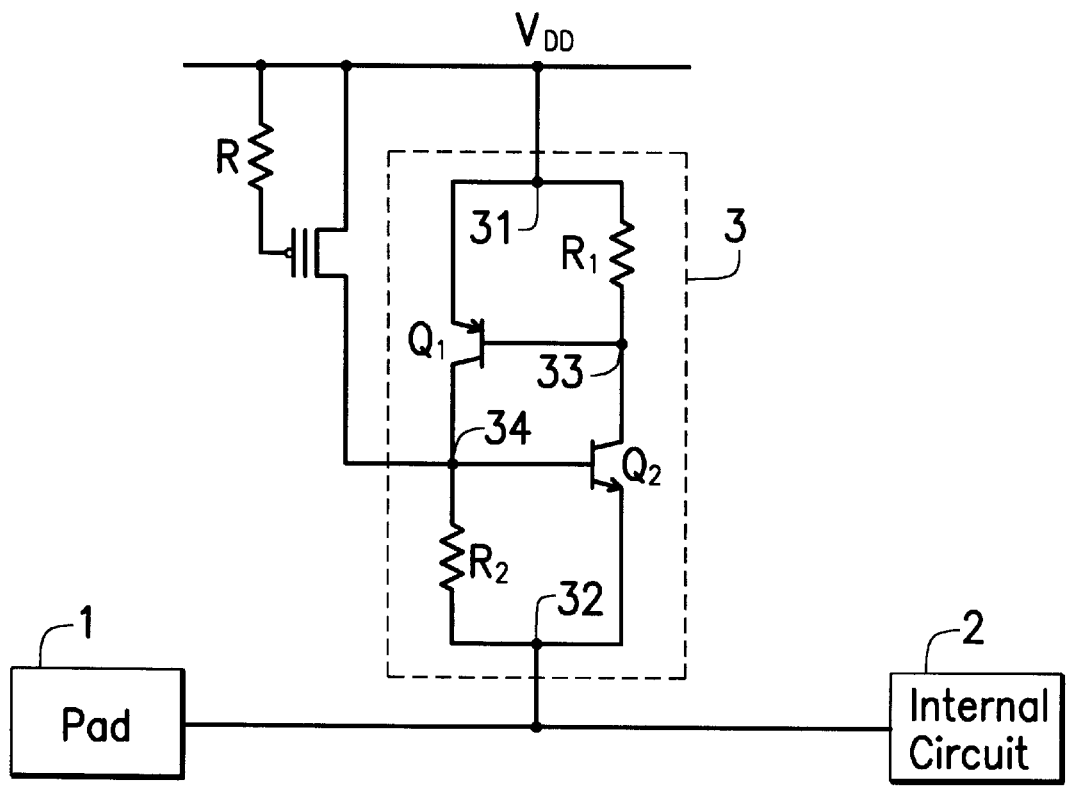
FIG. 3 schematically illustrates a circuit diagram of one preferred embodiment in accordance with the present invention.

Referring to FIG. 3, a circuit diagram of one preferred embodiment in accordance with the present invention is schematically illustrated. The ESD protection circuit according to the present invention is arranged at an integrated circuit pad 1, comprising at least one silicon-controlled rectifier 3, hereinafter SCR, and a P-type flash memory cell 4. The pad depicted in FIG. 3 could be an input pad, an output pad, or an I/O pad. One SCR 3 is exemplified in FIG. 3, but it is not intended to limit the scope of the invention to such a structure. Intuitively, a number of SCRs greater than one would be suitable for the present invention.

In FIG. 3, the SCR 3 is configured with its anode 31 connected to a power node $V_{DD}$ and its cathode 32 connected to the pad 1, respectively. The SCR 3 comprises a PNP bipolar junction transistor $Q_1$, a NPN bipolar junction transistor $Q_2$, and two load resistors $R_1$ and $R_2$. The emitter of the PNP bipolar junction transistor $Q_1$ serves as the anode 31 of the SCR 3. The PNP bipolar junction transistor $Q_1$ is configured with its base connected to the collector of the NPN bipolar junction transistor $Q_2$ to be an anode gate 33, and with its collector connected to the base of the NPN bipolar junction transistor $Q_2$ to be a cathode gate 34. The emitter of the NPN bipolar junction transistor $Q_2$ serves as the cathode 32 of the SCR 3. The resistor $R_1$ is connected between the anode 31 and the anode gate 33 while the resistor $R_2$ is connected between the cathode gate 34 and the cathode 32.

In addition, the P-type flash memory cell 4 is provided with its drain connected to the cathode gate 34 of the SCR 3, its source connected to the power node $V_{DD}$, and its control gate either directly connected to the power node $V_{DD}$ or coupled, as shown in FIG. 3, thereto by a resistor R.

Figure 4:
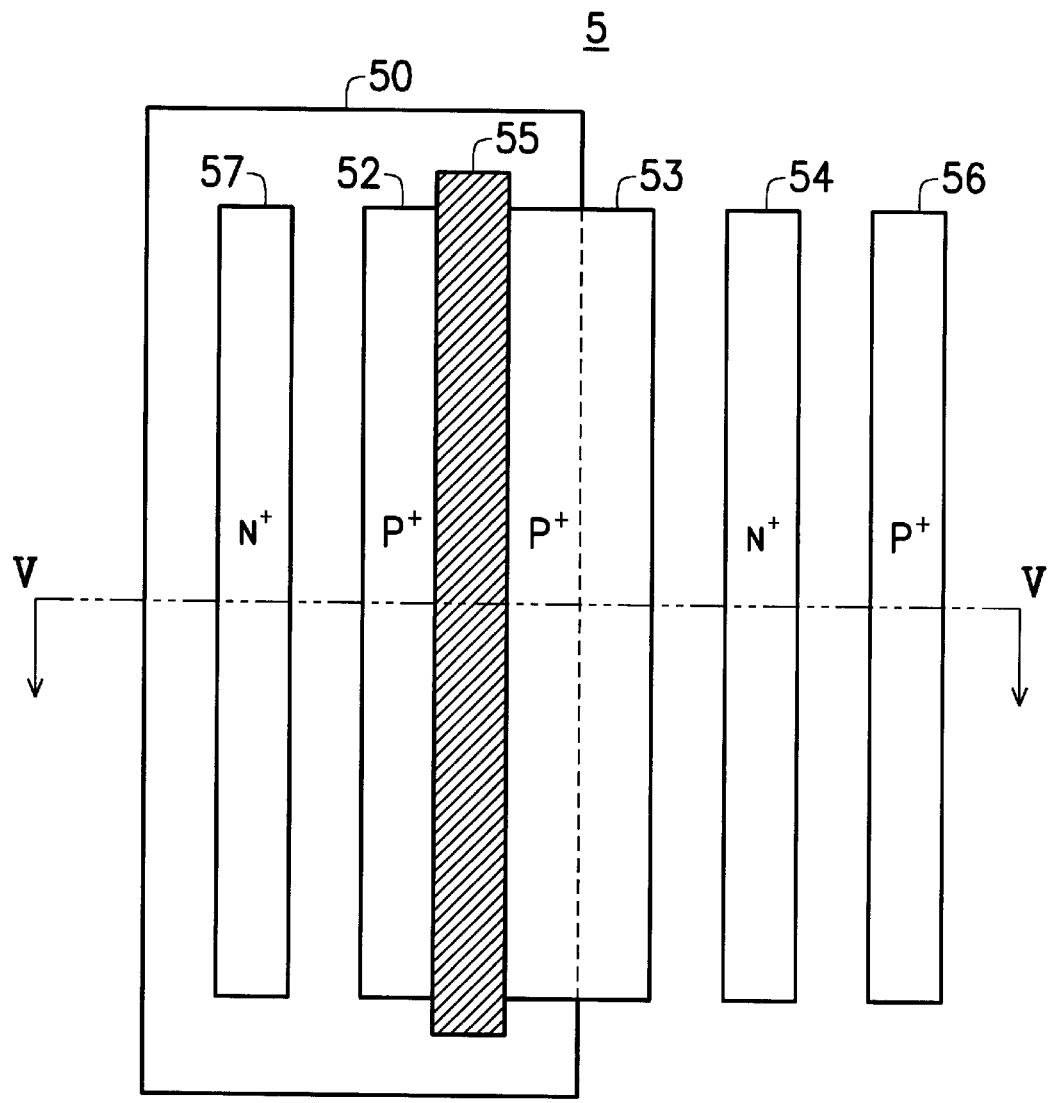
FIG. 4 schematically illustrates a layout top view of the circuit of FIG. 3 that is fabricated in a P-type silicon substrate.

Referring to FIG. 4, the circuit of FIG. 3 fabricated in a P-type silicon substrate 5 is schematically illustrated in a layout top view. FIG. 4 shows one example of several feasible embodiments. In the drawing, there is one N-well 50 formed in the P-type silicon substrate 5 so as to establish a P/N junction 51 therebetween. A first P-type doped regions 52 is formed in the N-well 50. A second P-type doped region 53 is configured with one portion formed in the P-type silicon substrate 5 and another portion formed in the N-well 50. In other words, the second P-type doped region 53 spans the P-type silicon substrate 5 and the N-well 50 over the junction 51. Moreover, the first and second P-type doped region 52 and 53 are spaced apart from each other. A first N-type doped region 54 is formed in the P-type silicon substrate 5 and spaced apart from the second P-type doped region 53. A gate structure 55 is formed to overlie a portion of the N-well 50 between the P-type doped regions 52 and 53. From bottom to top, the gate structure 55 comprises a gate dielectric layer 551, a floating gate layer 552, an inter-layer dielectric layer 553, and a control gate layer 554. Usually, the gate structure 55 somewhat overlaps the P-type doped regions 52 and 53 at two ends.

Figure 5:
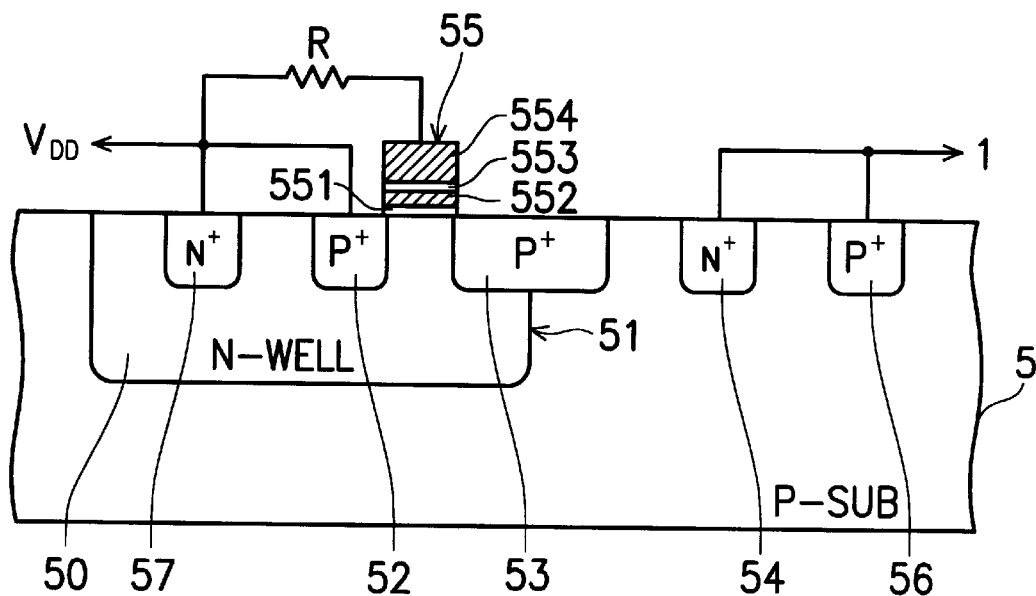
FIG. 5 schematically illustrates a cross-sectional view, taken along a line V—V, of FIG. 4.

In addition, a third P-type doped region 56, which is spaced apart from the first N-type doped region 54 in a direction away from the junction 51, is formed in the P-type silicon substrate 5 to be the ohmic contact region of the P-type silicon substrate 5. Moreover, a second N-type doped region 57 is formed in the N-well 50 to be the ohmic contact region thereof. FIG. 5 illustrates a cross-sectional view of FIG. 4 taken along a V—V line.

As shown in FIG. 5, the first P-type doped region 52, the N-well 50 and the P-type silicon substrate 5 serve as the emitter, base and collector of the PNP bipolar junction transistor $Q_1$, while the N-well 50, the P-type silicon substrate 5 and the first N-type doped region 54 constitute the collector, base and emitter of the NPN bipolar junction transistor $Q_2$. Accordingly, such a structure means that the base of the transistor $Q_1$ and the collector of the transistor $Q_2$ are tied together, and the collector of the transistor $Q_1$ and the base of the transistor $Q_2$ are tied together. Acting as the respective emitters of the transistors $Q_1$ and $Q_2$, the first P-type doped region 52 and the first N-type doped region 54 are connected to the power node $V_{DD}$ and the pad 1, accordingly. The second N-type doped region 57 is tied to the first P-type doped region 52 while the first N-type doped region 54 is electrically connected to the third P-type doped region 56. The resistors $R_1$ and $R_2$ stand for associated spreading resistance of the N-well 50 and the P-type silicon substrate 5 as well, so as to enhance the stability of the SCR 3.

Further referring to FIG. 5, the P-type flash memory cell 4 is provided with its drain, control gate, and source constituted by the second P-type doped region 53, gate structure 55, and first P-type doped region 52, respectively. The second P-type doped region 53 configured with one portion formed in the N-well 50 over the junction 51 is in contact with the base of the transistor $Q_2$. Moreover, the gate structure 55 is coupled to the power node $V_{DD}$ via the resistor R.

When ESD stress occurs to the pad 1, the drain-side junction of the P-type flash memory cell 4 enters breakdown at a voltage in the range of about 9~18 V. This breakdown voltage can be adjusted for optimization during fabrication process. After the P-type flash memory cell 4 breaks down, the SCR 3 immediately operates in the snapback region and conducts a discharge current. Therefore, the conduction of the SCR 3 can bypass the ESD stress that occurs to the pad 1 and the internal circuit 2 can be protected from ESD damage. Under normal operation, the control gate of the P-type memory cell 4 is powered by $V_{DD}$ via the resistor R, thereby the control gate is free of floating.

Moreover, when the P-type memory cell 4 enters breakdown, hot electrons are generated at the drain-side junction and then injected into the floating gate layer 552 through the gate dielectric layer 551 under the influence of the local high electric field, in other words, made available for programming. To program the P-type flash memory cell 4 means to change the conductance or the threshold voltage thereof. Thereafter, by measuring the conductance or threshold voltage of the P-type flash memory cell 4, whether the ESD stress occurs to the pad 1 during the phase of testing, installation, or even usage can be acknowledged. For example, a measurement method can be implemented by applying a voltage at the control gate and reading the current value at the drain.

Figure 6:
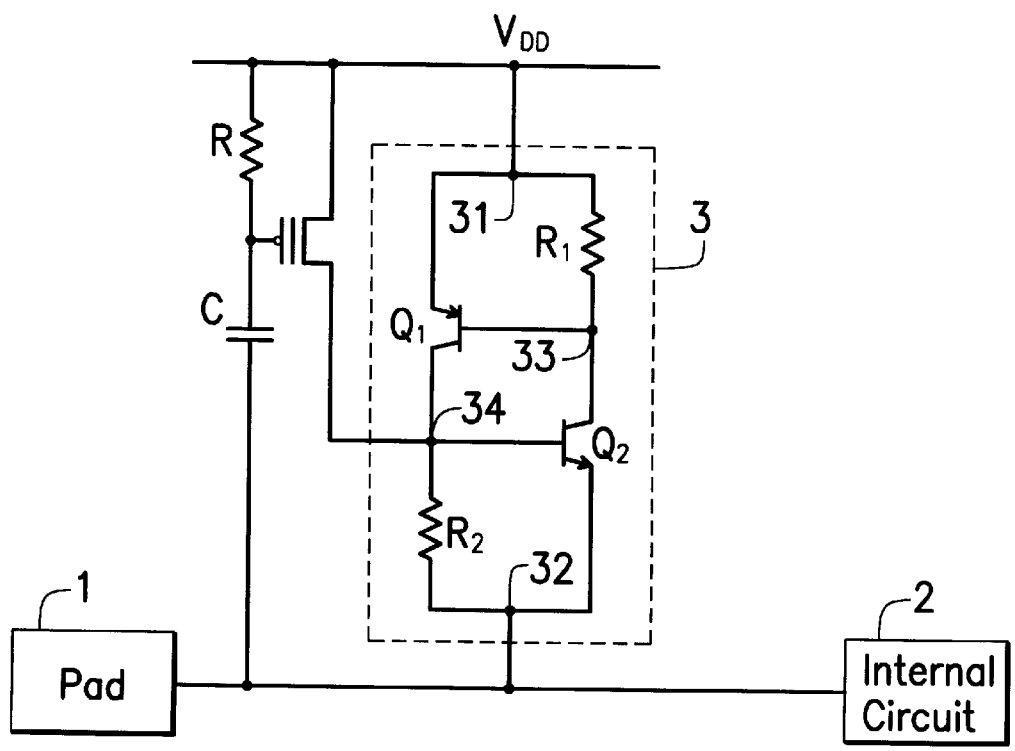
FIG. 6 schematically illustrates a circuit diagram of another preferred embodiment in accordance with the present invention.

Referring to FIG. 6, a circuit diagram of another preferred embodiment in accordance with the present invention is schematically illustrated. In addition to those features illustrated in FIG. 3, the control gate of the P-type flash memory cell 4 depicted in FIG. 6 is coupled to the pad 1 by a capacitor C. Therefore, when ESD stress occurs to the pad 1, the capacitor C couples a voltage to the control gate. If the resistor R and the capacitor C are appropriately chosen, the coupling voltage ranges from about half to about one-thirds of the drain voltage by which the P-type flash memory cell 4 is programmed. After that, the threshold voltage of the P-type flash memory cell 4 is increased. Furthermore, the capacitor C can maintain the high voltage coupling to the control gate for a period sufficient to program the P-type flash memory cell 4. Under normal operation, the control gate of the P-type flash memory cell 4 has the same electrical potential as $V_{DD}$ through the resistor R and thus is free of floating problems.

Sometimes, the P-type flash memory cell 4 can be termed as electrically erasable programmable read only memory (EEPROM) cell.

In conclusion, the electrostatic discharge protection circuit according to the present invention includes the P-type flash memory cell and a SCR device. When ESD stress occurs to the pad, the P-type flash memory cell enters breakdown and triggers the SCR to operate in the snapback region for bypassing the ESD stress in order to prevent the internal circuit from ESD damage. Accordingly, the electrostatic discharge protection circuit according to the present invention can be triggered at the low voltage at which the P-type flash cell enters breakdown. Moreover, the electrostatic discharge protection circuit according to the present invention can record any ESD event occurring during phases of testing, installation, usage, etc.

The foregoing description of preferred embodiments of the present invention has been provided for the purposes of illustration and description. It is not intended to be exhaustive or to limit the invention to the precise forms disclosed. Many modifications and variations will be apparent to practitioners skilled in the art. The embodiments were chosen and described to best explain the principles of the invention and its practical application, thereby enabling others skilled in the art to understand the invention, practice various other embodiments and make various modifications suited to the particular use contemplated. It is intended that the scope of the invention be defined by the following claims and their equivalents.

What is claimed is:

1. An electrostatic discharge protection circuit for protecting an internal circuit which is coupled to a pad, said electrostatic discharge protection circuit comprising:

a PNP transistor having its emitter connected to a power node;

an NPN transistor having its collector connected to a base of said PNP transistor, its base connected to a collector of said PNP transistor, and its emitter connected to said pad; and a P-type flash memory cell having a drain connected to the base of NPN transistor, a source connected to said power node, and a control gate coupled to said power node; wherein said flash memory cell enters breakdown to be programmed and triggers the conduction of said transistors when electrostatic discharge stress occurs at said pad.

2. The electrostatic discharge protection circuit as claimed in claim 1, said electrostatic discharge protection circuit being formed in a P-type silicon substrate, comprising:

an N-well formed in said P-type silicon substrate to establish a junction therebetween;

a first P-type doped region formed in said N-well;

a second P-type doped region having one portion formed in said P-type silicon substrate and another portion formed in said N-well over said junction and being spaced apart from said first P-type doped region;

a first N-type doped region formed in said P-type silicon substrate and spaced apart from said second P-type doped region; and a gate structure, which is constituted by a gate dielectric layer, a floating gate layer, an inter-layer dielectric layer, and a control gate layer, overlying a portion of said N-well between said P-type doped regions.

3. The electrostatic discharge protection circuit as claimed in claim 2, further comprising:

a first load resistor connected between the emitter and base of said PNP transistor; and a second load resistor connected between the emitter and base of said NPN transistor.

4. The electrostatic discharge protection circuit as claimed in claim 3, further comprising:

a third P-type doped region formed in said P-type silicon substrate; and a second N-type doped region formed in said N-well.

5. The electrostatic discharge protection circuit as claimed in claim 1, further comprising a resistor connected between said control gate and said power node.

6. The electrostatic discharge protection circuit as claimed in claim 5, further comprising a capacitor connected between said pad and said control gate.

7. An electrostatic discharge protection circuit for protecting an internal circuit which is coupled to a pad, said electrostatic discharge protection circuit comprising:

a PNP transistor having its emitter connected to a power node;

a NPN transistor having its collector connected to a base of said PNP transistor, its base connected to a collector of said PNP transistor, and its emitter connected to said pad; and a P-type flash memory cell having a drain connected to the base of said NPN transistor, a source connected to said power node, and a control gate coupled to said power node;

a capacitor connected between said control gate and said pad; and is a resistor connected between said control gate and said power node;

wherein said flash memory cell enters breakdown to be programmed and triggers the conduction of said transistors via said capacitor when electrostatic discharge stress occurs at said pad, wherein said control gate has the same electrical potential as that of said power node by said resistor under normal operation.

8. The electrostatic discharge protection circuit as claimed in claim 7, further comprising:

a first load resistor connected between the emitter and base of said PNP transistor; and a second load resistor connected between the emitter and base of said NPN transistor.

* * * * *